(12) United States Patent
Hsieh

(10) Patent No.: US 8,222,108 B2
(45) Date of Patent: Jul. 17, 2012

(54) METHOD OF MAKING A TRENCH MOSFET HAVING IMPROVED AVALANCHE CAPABILITY USING THREE MASKS PROCESS

(75) Inventor: Fu-Yuan Hsieh, Kaohsiung (TW)

(73) Assignee: Force MOS Technology Co., Ltd., Kaohsiung (TW)

( * ) Notice: Subject to any disclaimer, the term of this patent is extended or adjusted under 35 U.S.C. 154(b) by 476 days.

(21) Appl. No.: 12/458,298

(22) Filed: Jul. 8, 2009

(65) Prior Publication Data

US 2011/0008939 A1   Jan. 13, 2011

(51) Int. Cl.
*H01L 21/336* (2006.01)
(52) U.S. Cl. .................. 438/270; 438/259; 438/269
(58) Field of Classification Search .................. 438/268, 438/269, 270, 272, 259
See application file for complete search history.

(56) References Cited

U.S. PATENT DOCUMENTS

| | | | | |
|---|---|---|---|---|
| 7,847,346 B2 * | 12/2010 | Chung et al. | ................... | 257/330 |
| 7,897,461 B2 * | 3/2011 | Takami | ......................... | 438/270 |
| 7,994,572 B2 * | 8/2011 | Kim | .............................. | 257/330 |
| 8,034,686 B2 * | 10/2011 | Hsieh | ............................ | 438/270 |

\* cited by examiner

*Primary Examiner* — Kevin M Picardat
(74) *Attorney, Agent, or Firm* — Bacon & Thomas, PLLC

(57) ABSTRACT

A method of forming trench MOSFET structure having improved avalanche capability is disclosed. In a preferred embodiment according to the present invention, only three masks are needed in the fabricating process, wherein the source region is formed by performing source Ion Implantation through contact open region of a thick contact interlayer for saving source mask. Furthermore, said source region has a doping concentration along channel region lower than along contact trench region, and source junction depth along channel region shallower than along contact trench, and source doping profile along surface of epitaxial layer has Guassian-distribution from trenched source -body contact to channel region.

8 Claims, 19 Drawing Sheets

METHOD OF MAKING A TRENCH MOSFET HAVING IMPROVED AVALANCHE CAPABILITY USING THREE MASKS PROCESS

FIELD OF THE INVENTION

This invention relates generally to the cell structure and device configuration of semiconductor devices. More particularly, this invention relates to an improved trenched MOSFET configuration having improved avalanche capability by three masks process.

BACKGROUND OF THE INVENTION

Please refer to FIG. 1A for a conventional N-channel trench MOSFET structure of prior art (U.S. Pat. No. 6,888, 196) with an N+ source regions having same surface doping concentration and junction depth along trenched source-body contact and channel region. The disclosed N-channel trench MOSFET cell is formed in an N epitaxial layer 102 supported on an N+ substrate 100. Near the top surface of a P body region 103, which is formed within said epitaxial layer 102, N+ source region 104 is implanted around the top portion of trenched gates 105 and adjacent to the sidewalls of trenched source-body contact 106. As mentioned above, said N+ source region 104 has a same surface doping concentration and a same junction depth (Ds, as illustrated in FIG. 1A) along epitaxial surface, which is related to the formation process of said N+ source regions 104.

FIG. 1B shows the fabrication method of said N+ source regions 104. After the formation of the P body region 103 and its diffusion, said N+ source regions 104 is formed by performing source Ion Implantation through a source mask (not shown). The top surface of said P body region 103 suffered the same source Ion Implantation and the same N+ dopant diffusion step, therefore said N+ source regions has same doping concentration and same junction depth (Ds, as shown in FIG. 1A) along epitaxial surface.

This uniform distribution of doping concentration and junction depth of said N+ source regions may lead to a hazardous failure during UIS (Unclamped Inductance Switching) test, please refer to FIG. 1C for a top view of said N+ source region 104 and said trenched source-body contact 106 shown in FIG. 1A. As illustrated, $R_{bc}$ is the base resistance from said trenched source-body contact 106 to the cell corner, $R_{be}$ is the base resistance from said trenched source-body contact 106 to the cell edge. Obviously, $R_{bc}$ is greater than $R_{be}$ because the distance from said trenched source-body contact 106 to the cell corner is longer than that from said trenched source-body contact 106 to the cell edge, resulting in said UIS failure occurring at the trench corner and a poor avalanche capability for closed cell at cell corners as the parasitic NPN bipolar transistor is easily turned on.

Accordingly, it would be desirable to provide a new and improved device configuration to avoid the UIS failure occurred at the trench corner in a trench MOSFET while having a better avalanche capability.

SUMMARY OF THE INVENTION

It is therefore an object of the present invention to provide new and improved device configuration to solve the problems discussed above.

One aspect of the present invention is that, the source region is formed by performing source Ion Implantation through open region of a thick contact interlayer covering the epitaxial layer, which means source region is implanted after the formation of the thick contact interlayer, as shown in FIG. 2A. Using this method, the doping concentration of said source region along the epitaxial surface is Gaussian-distributed from the contact window to channel region, and the junction depth of said source region is shallower in channel region than that in contact open region, resulting in a lower base resistance than prior art.

Another aspect of the present invention is that, in a preferred embodiments, the dopant of source region is diffused to just reach cell edge, please refer to FIG. 2B for a top view of an N-channel trench MOSFET structure, the dash-dotted line illustrate the area of N+ source region with a doping concentration no less than $1 \times 10^{19}$ $cm^{-3}$. At cell corners, the N region has a lower doping concentration due to the Gaussian-distribution, which is less than $1 \times 10^{19}$ $cm^{-3}$. Therefore, a Source Ballast Resistance (SBR) of said N region exists at cell corners, which reduces the Emitter injection efficiency of the parasitic NPN bipolar transistor, thus rendering it difficult to turn on, avoiding the UIS failure issue and improving the avalanche capability.

Another aspect of the present invention is that, in a preferred embodiment, the dopant of source region is diffused further after reaching the cell edge to optimize trade-off between $R_{ds}$ (resistance between drain and source) and avalanche capability, please refer to FIG. 2C for another top view of an N-channel trench MOSFET structure. At the cell edge, the N+ source region is adjacent to the gate oxide, while at the cell corner, the area of lower doped N regions is smaller than that in FIG. 2B. It seems that the source resistance is reduced at cell corner, breaching the desire of enhancing the avalanche capability, however, as the $R_{ds}$ is the same important, and it is reduced by shortening the distance of highly doped region to the cell edge, therefore, a trade-off is achieved between the avalanche capability and the $R_{ds}$, optimizing the device to a better performance.

Another aspect of the present invention is that, the semiconductor power device has a thick contact interlayer comprising a layer of un-doped SRO (Silicon Rich Oxide) and a layer of BPSG (Boron Phosphorus Silicon Glass) or PSG (Phosphorus Silicon Glass) whereon. When forming the trenched source-body contact, the contact width within said BPSG or PSG layer is wider than that in un-doped SRO layer because during etching process, the BPSG or PSG has about 5~10 times etch rate of un-doped SRO if dilute HF chemical is used, resulting in a reduction of contact resistance between the contact filling-in tungsten plug and source metal.

Another aspect of the present invention is that, the semiconductor power device has vertical trenched source-body contact penetrating said thick contact interlayer, said source region, and into said body region. Especially, the contact width within said BPSG or PSG layer is wider than that in other portion.

Another aspect of the present invention is that, the semiconductor power device has a trenched source-body contact with vertical sidewalls in said thick contact interlayer and said source region, and has slope sidewalls in body region to enlarge heavily-doped body contact resistance reduction area wrapping said slope trench contact and the bottom to further improve device avalanche capability.

Another aspect of the present invention is that, in an embodiment of the present invention, the trenched source-body contact is filled with source metal instead of tungsten plug to enhance the metal contact performance and reduce the fabrication cost.

Another aspect of the present invention is that, in a preferred embodiment, the semiconductor power device has a termination area with trenched floating rings for saving body mask during fabrication process.

Another aspect of the present invention is that, in a preferred embodiment, the semiconductor power device has source ion implantation through contact mask for saving source mask during fabrication process.

Another aspect of the present invention is that, the fabrication cost is reduced as only three masks (trenched gates mask, trenched contacts mask and metal mask) are needed during fabrication process.

Briefly, in a preferred embodiment, as shown in FIG. 3A, which is also the $X_1$-$X_1'$ cross section view of FIG. 2B and FIG. 2C, the present invention discloses a trench MOSFET formed on a substrate heavily doped with a first semiconductor doping type. Onto said substrate, an epitaxial layer of a first semiconductor doping type is grown with a doping concentration lower than that of said substrate. A plurality of trenches are etched within said epitaxial layer and filled with doped poly padded with a gate oxide to form trenched gates. Body region of a second semiconductor doping type is extending between every two adjacent trenched gates. Onto the top surface of said epitaxial layer, a thick contact interlayer comprising of a layer of un-doped SRO and a layer of BPSG or PSG whereon. Near the top surface of said body region, source region heavily doped with a first semiconductor doping type is implanted through the open region of said thick contact interlayer to form source region with Gaussian-distribution from said open region to channel region. Trenched source-body contact with vertical sidewalls, which is filled with tungsten plugs padded with barrier layer of Ti/TiN or Co/TiN, is penetrating through said thick contact interlayer, said source region and into said body region to electrically contact said source region and said body region with source metal. Especially, the contact width in top BPSG or PSG layer is wider than that in lower SRO layer for the reduction of contact resistance between said tungsten plugs and said source metal. Around each bottom of said trenched source-body contact, a body contact resistance reduction area heavily doped with a second semiconductor doping type is formed to further reduce the contact resistance. Source metal is deposited onto a resistance-reduction layer of Ti or TiN to electrically contact with said tungsten plug. Drain metal is deposited onto the rear side of said substrate after grinding.

Briefly, in another preferred embodiment, as shown in FIG. 4, the present invention discloses a trench MOSFET similar to that in FIG. 3A except that, the trenched source-body contact in FIG. 4, which is filled with tungsten plugs padded with barrier layer of Ti/TiN, has vertical contact trench sidewalls within said thick contact interlayer and said source region, and has slope contact trench sidewalls within said body region.

Briefly, in another preferred embodiment, as shown in FIG. 5, the present invention discloses a trench MOSFET similar to that in FIG. 3A except that, said trenched source-body contact in this embodiment is filled with source metal instead of tungsten plugs, to further enhance the contact performance and reduce the fabrication cost.

Briefly, in another preferred embodiment, as shown in FIG. 6, the present invention discloses a trench MOSFET similar to that in FIG. 4 except that, said trenched source-body contact in this embodiment is filled with source metal instead of tungsten plugs, to further enhance the contact performance and reduce the fabrication cost.

Briefly, in another preferred embodiment, as shown in FIG. 8, the present invention discloses a trench MOSFET with termination area having trenched floating rings. In active area, the structure can be same as that in FIG. 3A, in termination area, a plurality of trenched floating rings are formed from top surface of said body region and extending into said epitaxial layer. By employing said trenched floating rings, the body mask is saved, and on the other hand, the breakdown voltage of device is enhanced. Between said active area and said termination area, a wider trenched gate for gate connection is formed to electrically contact said trenched gate with gate metal via a trenched gate contact. Especially, the width of said trenched gate contact in top BPSG or PSG layer is wider than that in lower portion.

This invention further disclosed a method of manufacturing a semiconductor power device with three masks. The method includes a step of forming a plurality of trench MOSFET cells having source region with Gaussian-distribution from the contact opening area of a thick contact interlayer covering the epitaxial layer to channel region. The method further includes a step of forming a trenched source-body contact with different contact width. In an exemplary embodiment, the step of forming said source region with Gaussian-distribution further comprises applying a contact mask onto said thick contact interlayer to etch the contact trench through which the source ion implantation is carried out and diffused to form Gaussian-distribution from the contact trench opening to channel region. In another exemplary embodiment, the step of forming said trenched source-body contact with different width further comprises wet etching in dilute HF of said thick contact interlayer which comprising a BPSG or PSG layer and an un-doped SRO layer underneath, as the BPSG or PSG layer has a etch rate 5~10 times of that in un-doped SRO layer, the width of contact trench within said BPSG or PSG layer is wider than that within said un-doped SRO layer. In another exemplary embodiment, the method further comprises a step of forming said trenched source-body contact with vertical or slope sidewalls (not shown). In another exemplary embodiment, the method further comprises a step of forming said trenched source-body contact with vertical sidewalls in said thick contact interlayer and said source region, and has a slop sidewalls within the body region. In another exemplary embodiment, the method further comprises a step of forming said trenched source-body contact filled with tungsten plug padded with a layer of Ti/TiN or Co/TiN as barrier layer. In another exemplary embodiment, the method further comprises a step of forming said trenched source-body contact filled with source metal which is Al alloys onto a barrier layer of Ti/TiN or Co/TiN.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Figure 1A:
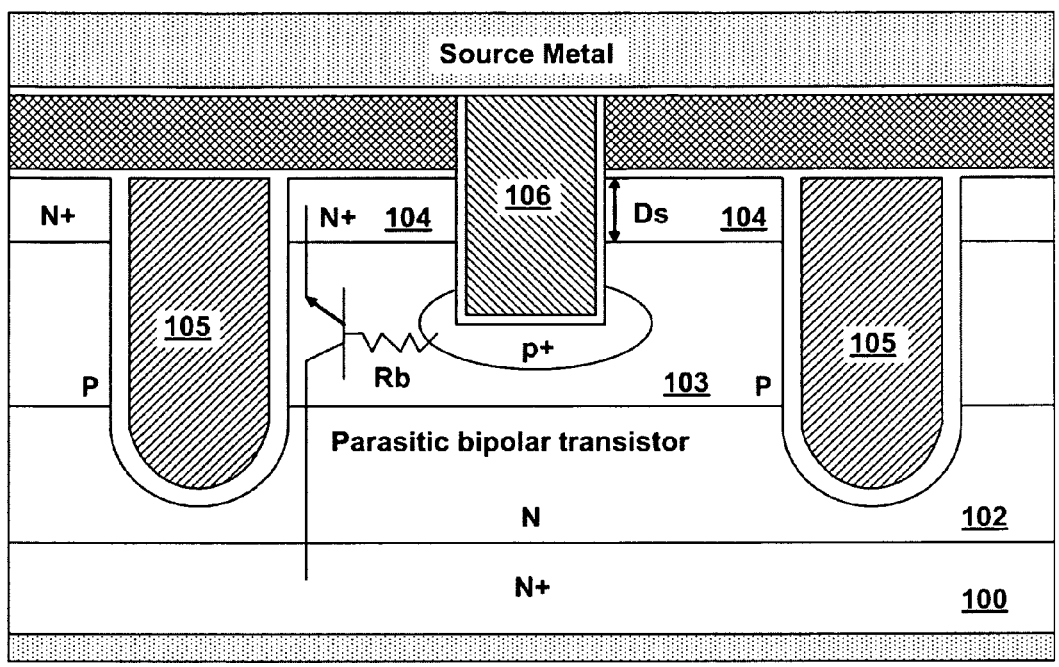
FIG. 1A is a side cross-sectional view of a prior art.
Figure 1B:
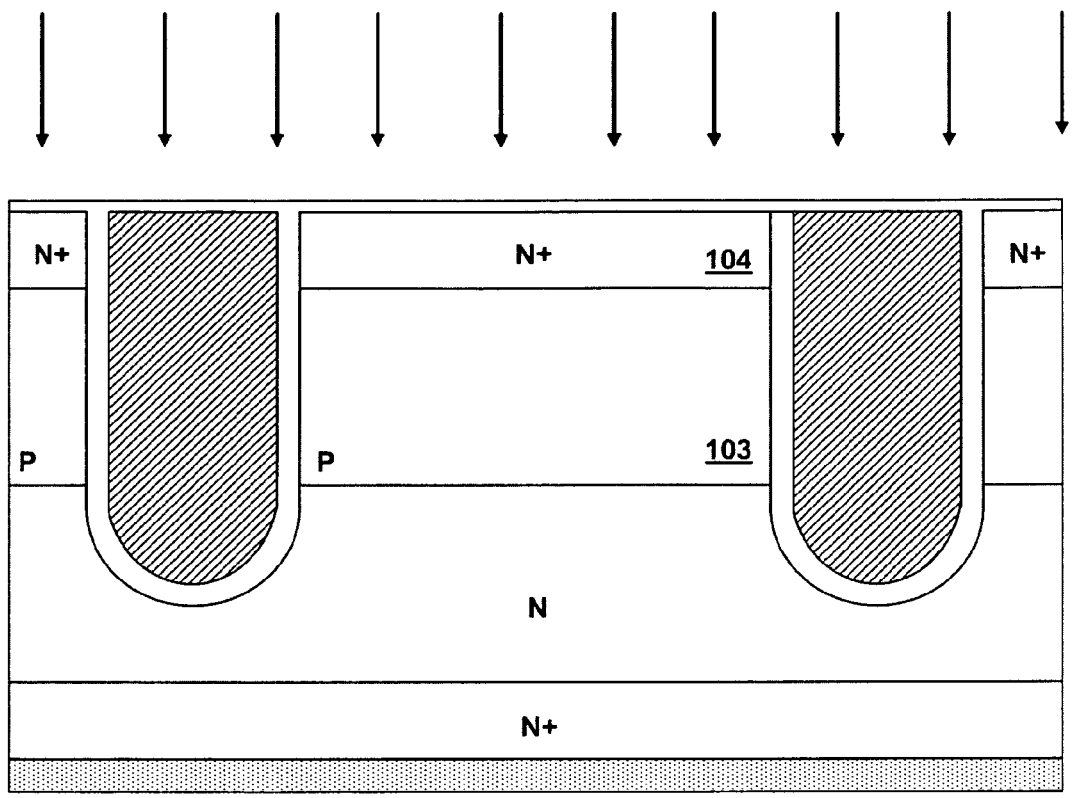
FIG. 1B is a side cross-sectional view or prior art for showing the formation method of source region in prior art.
Figure 1C:
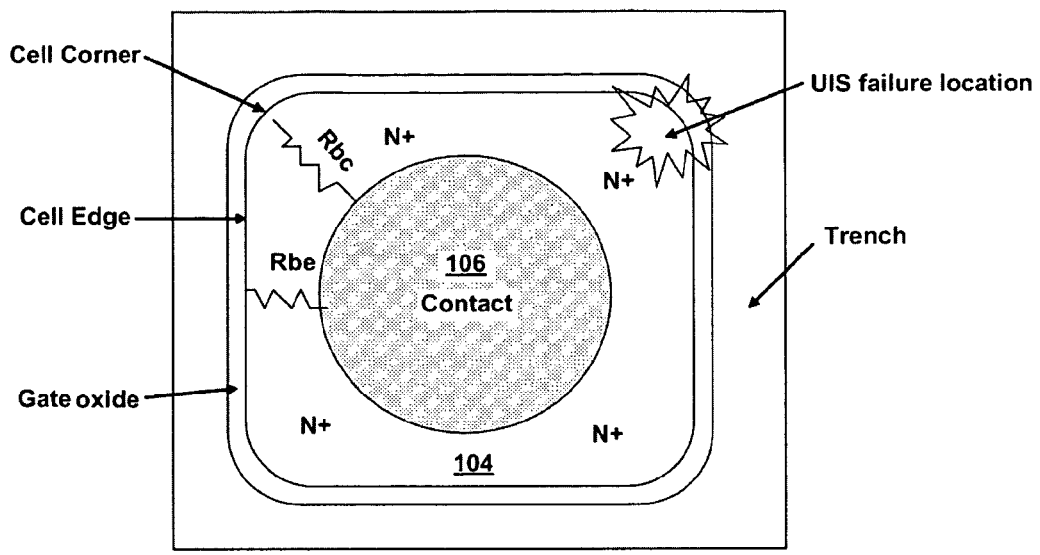
FIG. 1C is a top view of prior art for showing the disadvantage of prior art.
Figure 2A:
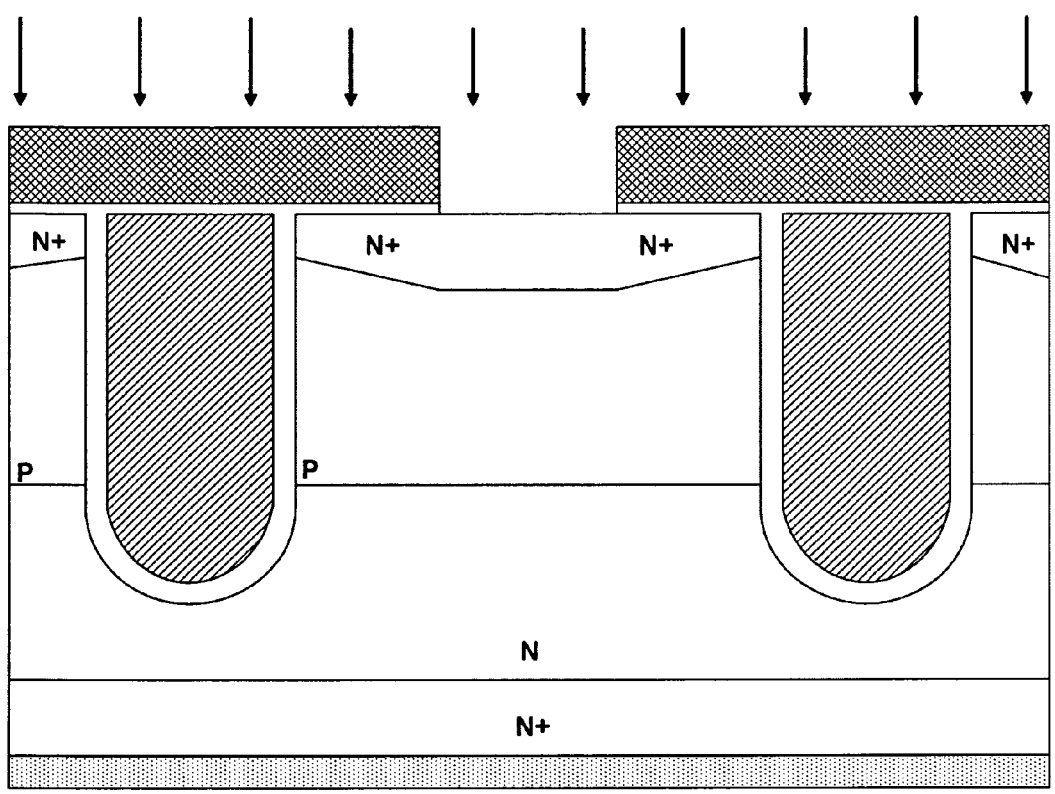
FIG. 2A is a side cross-sectional view for showing the formation method of source region according to the present invention.
Figure 2B:
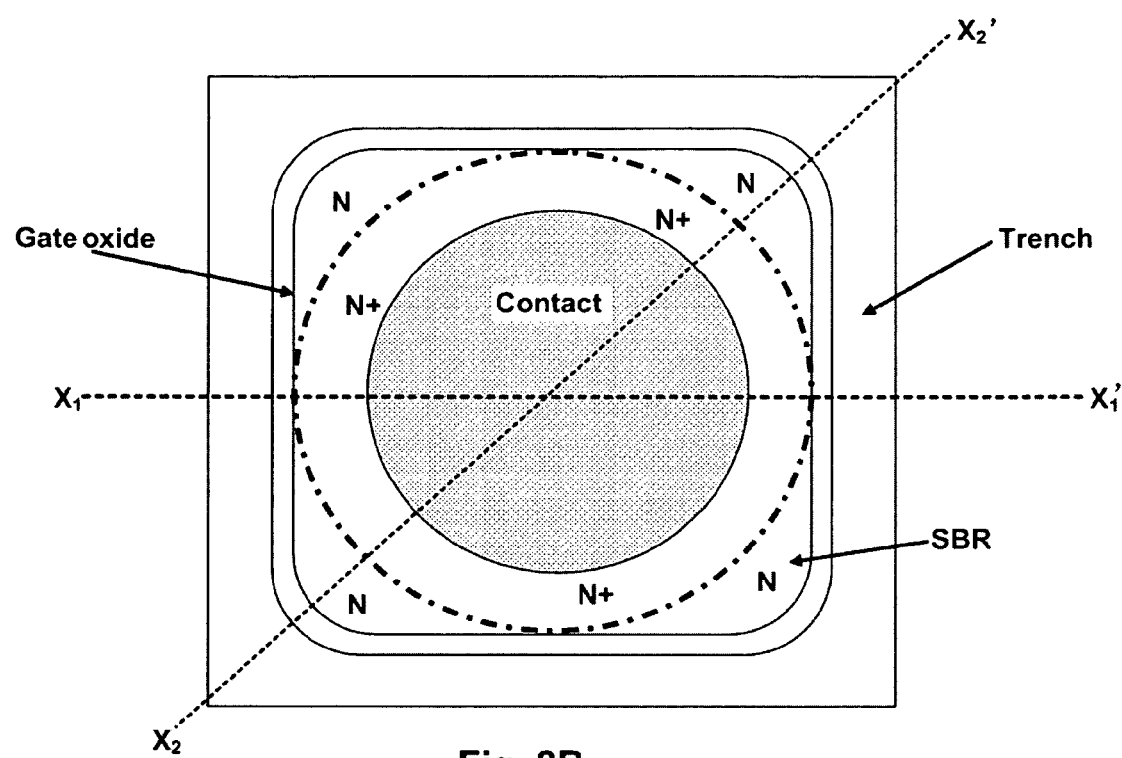
FIG. 2B is a top view for showing a source region diffusion method according to the present invention.
Figure 2C:
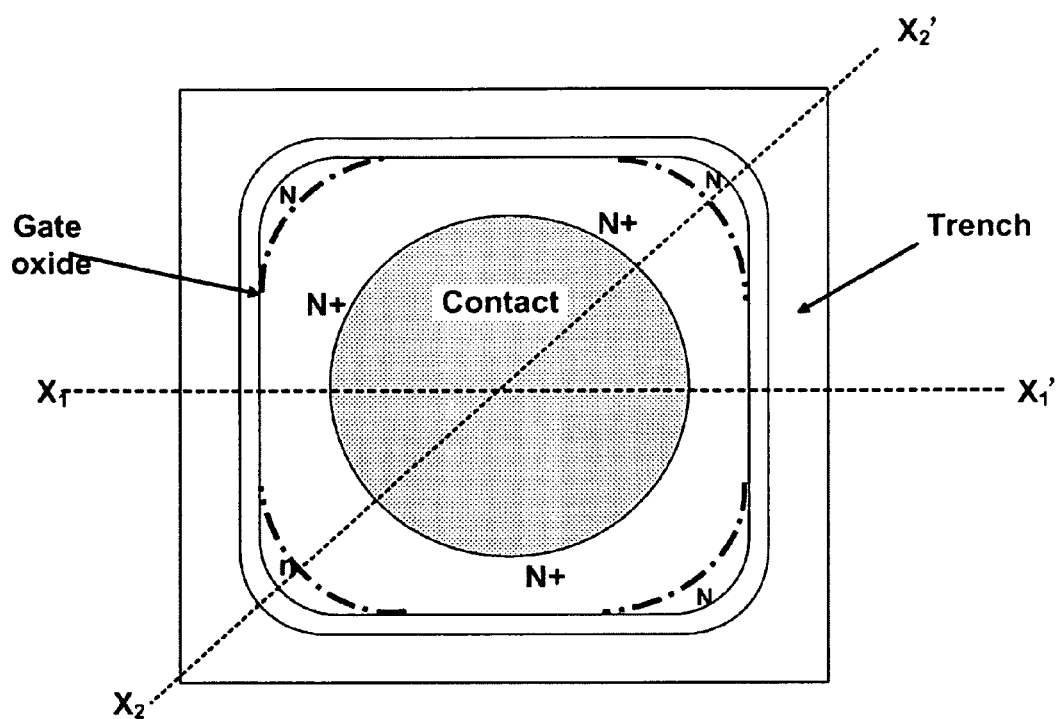
FIG. 2C is a top view for showing another source region diffusion method according to the present invention.
Figure 3A:
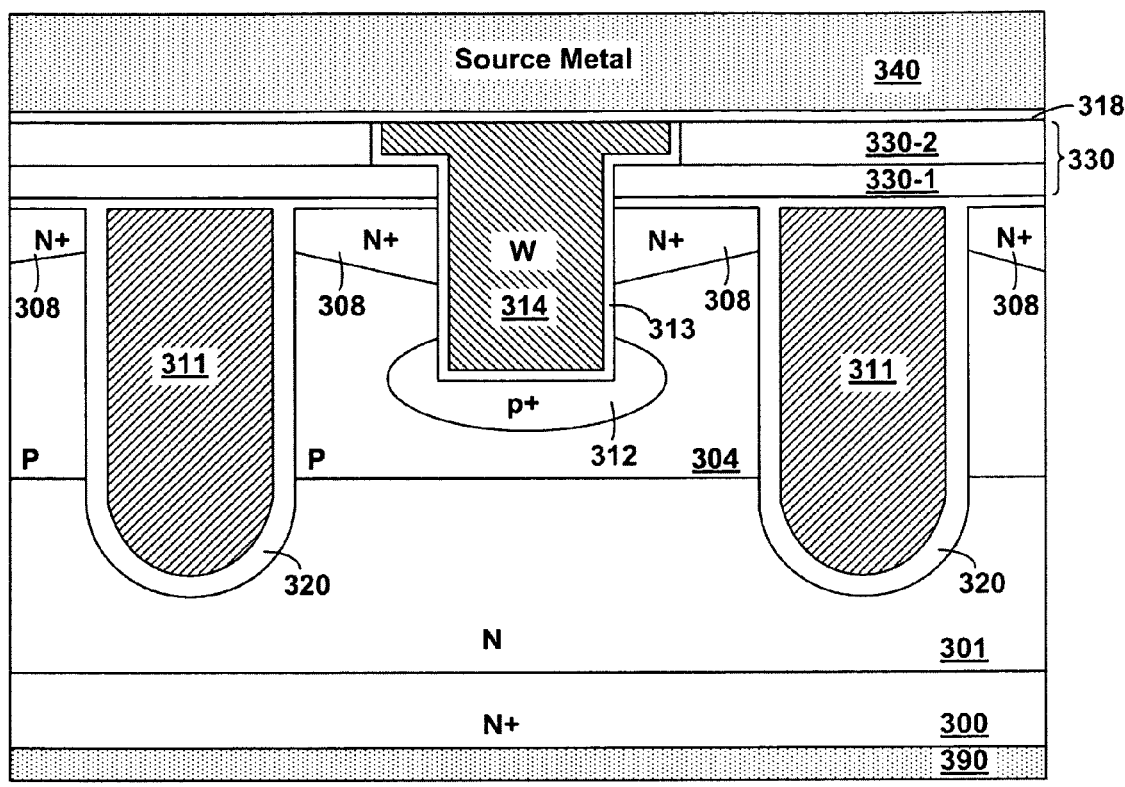
FIG. 3A is a side cross-sectional view of an N-channel trench MOSFET showing a preferred embodiment according to the present invention, which is also the $X_1$-$X_1'$ cross section in FIG. 2A.

Please refer to FIG. 3A for a preferred embodiment of the present invention, which also is the $X_1$-$X_1'$ cross section of FIG. 2B and FIG. 2C, where an N-channel trench MOSFET is formed on a heavily N+ doped substrate 300 coated with back metal 390 on rear side as drain electrode. Onto said substrate 300, a lighter N doped epitaxial layer 301 is grown, and a plurality of trenches are etched wherein. Doped poly is filled into these trenches padded with a gate oxide layer 320 to serve as trenched gates 311. P body region 304 is extending between two adjacent trenched gates 311, and near the top surface of said P body region, N+ source regions 308 is formed with Gaussian-distribution from the open region of a thick contact interlayer 330 to channel region. Said thick contact interlayer is composed of a layer of un-doped SRO 330-1 and a layer of BPSG or PSG 330-2. Trenched source-body contact filled with tungsten plug 314 which is padded with a barrier layer 313 of Ti/TiN or Co/TiN, are formed by penetrating through said thick contact interlayer 330, said source region 308 and extending into said P body region 304 with vertical sidewalls or slope sidewalls (not shown). Especially, the width of said trenched source-body contact in the BPSG or PSG layer 330-2 is wider than that in other portion. Underneath the bottom of said trenched source-body contact, a p+ body contact resistance reduction area 312 is implanted to further reduce the contact resistance between said tungsten plug 314 and said body region 304. Onto a resistance-reduction layer 318 of Ti or Ti/TiN, source metal 340 composed of Al alloys is deposited to electrically contact with tungsten plug 314.

Figure 3B:
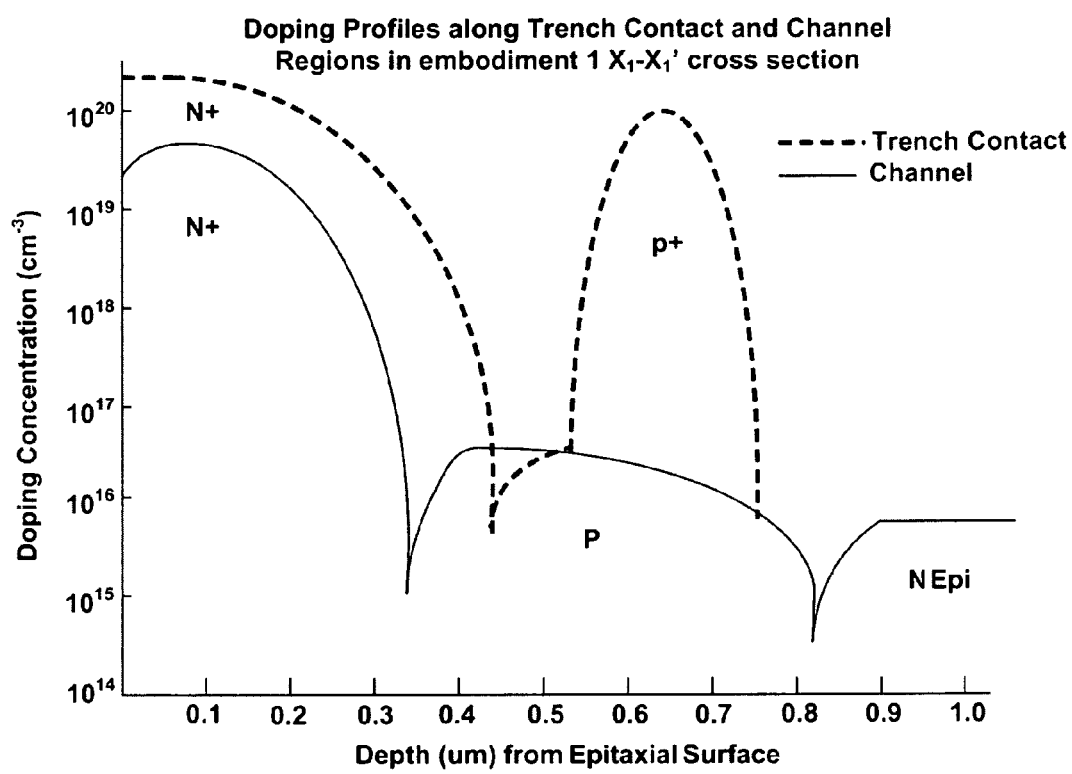
FIG. 3B is the doping profiles for showing the relationship between depth from epitaxial surface and doping concentration in trench contact and channel region, respectively.
Figure 3C:
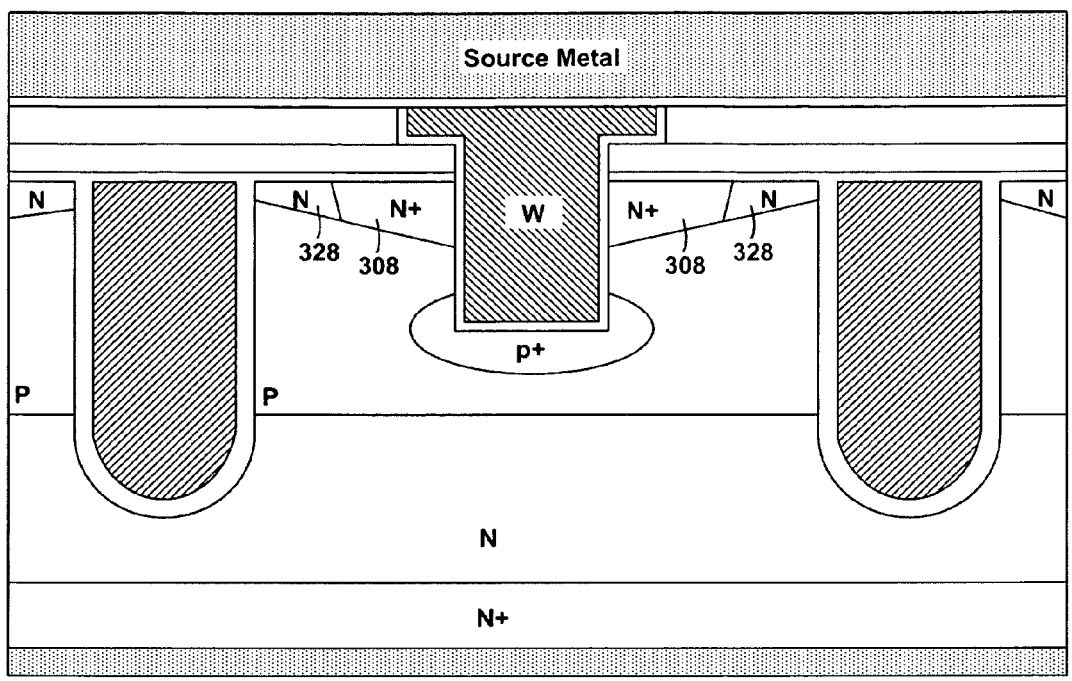
FIG. 3C is the side cross-sectional view of the preferred embodiment shown in FIG. 3A for showing the $X_2$-$X_2'$ cross section in FIG. 2A.

In order to further make clear, FIG. 3B illustrates the doping profiles along said trenched source-body contact and the channel region from said epitaxial surface in N-channel trench MOSFET shown in FIG. 3A. In FIG. 3B, N+ represents said N+ source region 308, P represents said P body region 304, p+ represents said p+ contact area 312. FIG. 3C shows the $X_2$-$X_2'$ cross section of FIG. 2B and FIG. 2C. In cell corners, N region 328 has a lower doping concentration than said N+ source region 308, resulting in a lower source resistance to further enhance avalanche capability.

Figure 4:
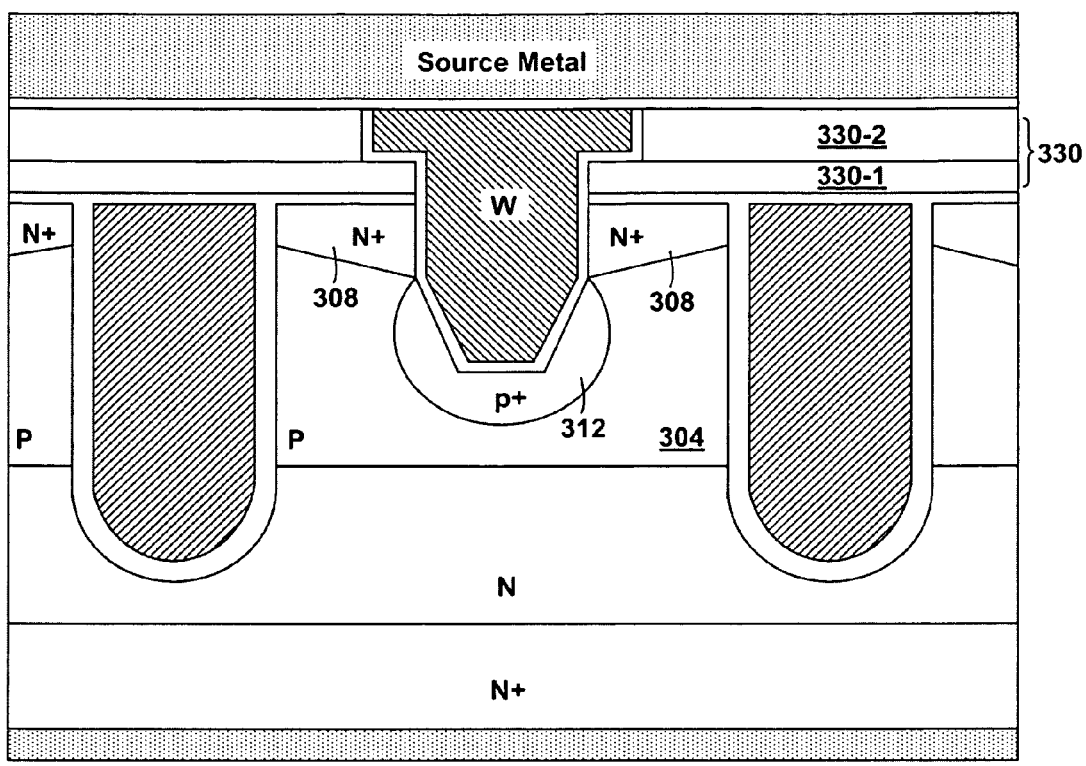
FIG. 4 is the side cross-sectional view of an N-channel trench MOSFET showing another preferred embodiment according to the present invention.

Please refer to FIG. 4 for another preferred embodiment of the present invention which also shows the $X_1$-$X_1'$ cross section of FIG. 2B and FIG. 2C. In FIG. 4, the N-channel trench MOSFET is similar to that in FIG. 3A except that, said trenched source-body contact has vertical sidewalls within said thick contact interlayer 330 and said N+ source region 308, and has slope sidewalls within said P body region 304. By employing this structure, p+ body contact resistance reduction area 312 is enlarged to wrap the slope sidewalls and the bottom of said trenched source-body contact to further enhance avalanche capability.

Figure 5:
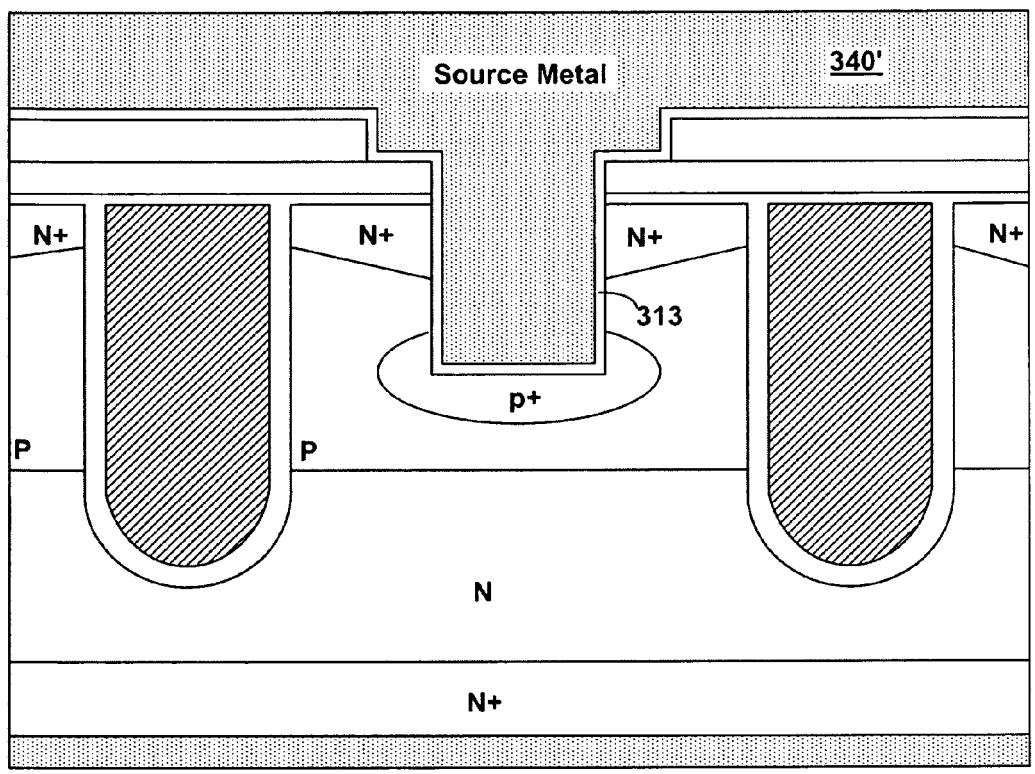
FIG. 5 is the side cross-sectional view of an N-channel trench MOSFET showing another preferred embodiment according to the present invention.

Please refer to FIG. 5 for another preferred embodiment of the present invention which also shown the $X_1$-$X_1'$ cross section of FIG. 2B and FIG. 2C. In FIG. 5, the N-channel trench MOSFET is similar to that in FIG. 3A except that, said trenched source-body contact is not filled with tungsten plug, but the source metal 340' over said barrier layer 313. By employing this structure, the contact performance between said N+ source region and said P body region with said source metal is improved.

Figure 6:
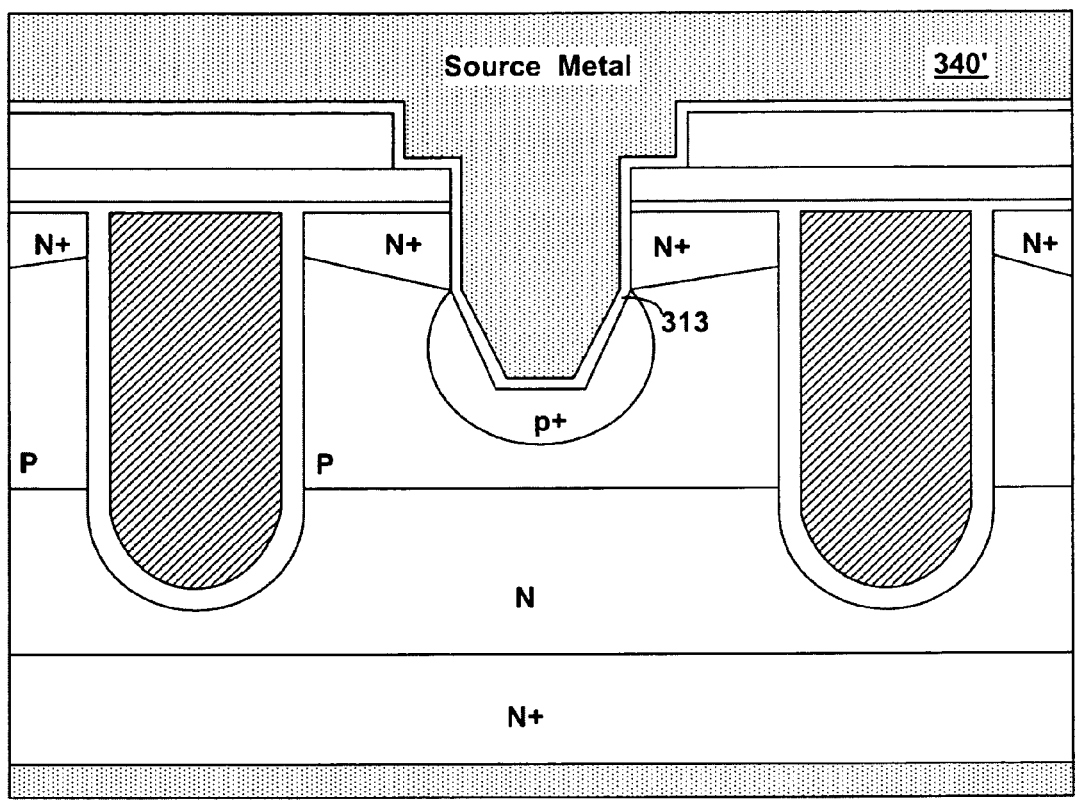
FIG. 6 is the side cross-sectional view of an N-channel trench MOSFET showing anther preferred embodiment according to the present invention.

Please refer to FIG. 6 for another preferred embodiment of the present invention which also shown the $X_1$-$X_1'$ cross section of FIG. 2B and FIG. 2C. In FIG. 6, the N-channel trench MOSFET is similar to that in FIG. 4 except that, said trenched source-body contact is not filled with tungsten plug, but the source metal 340' over said barrier layer 313. By employing this structure, the contact performance between said N+ source region and said P body region with said source metal is improved.

Figure 7A:
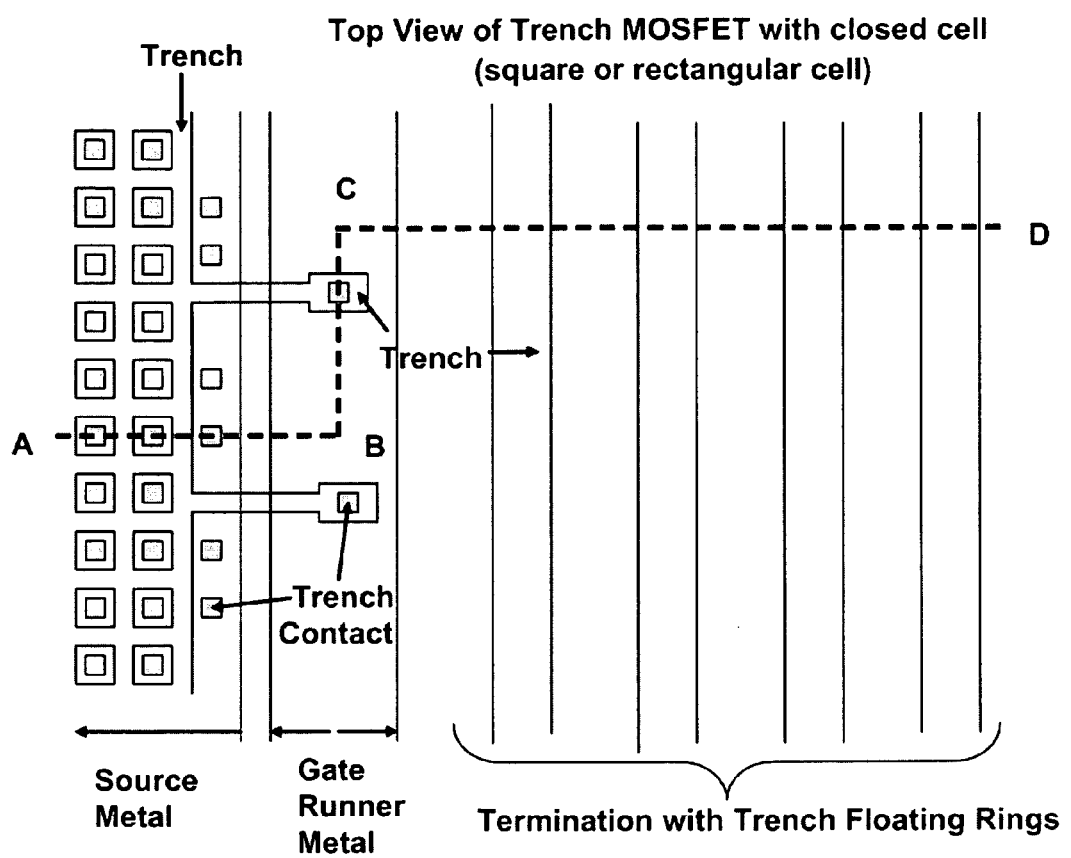
FIG. 7A is the top view of trench MOSFET with closed cell according to the present invention.
Figure 7B:
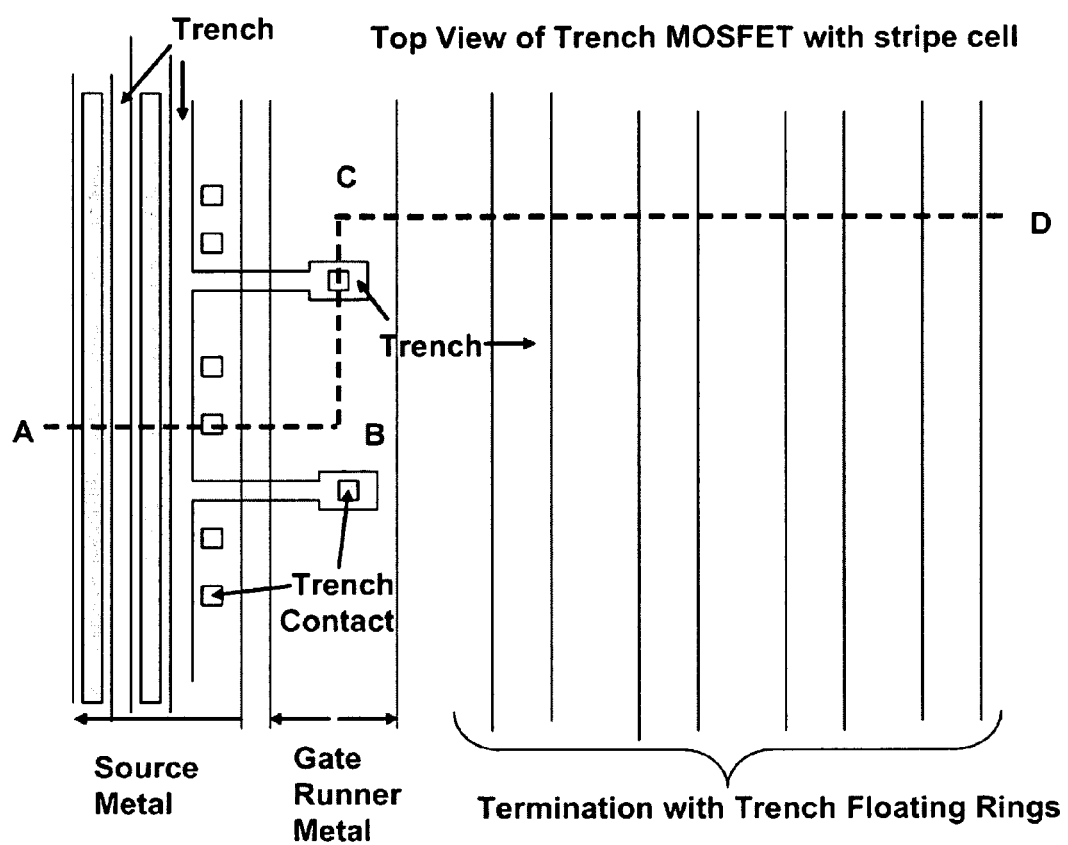
FIG. 7B is the top view of trench MOSFET with stripe cell according to the present invention.
Figure 8:
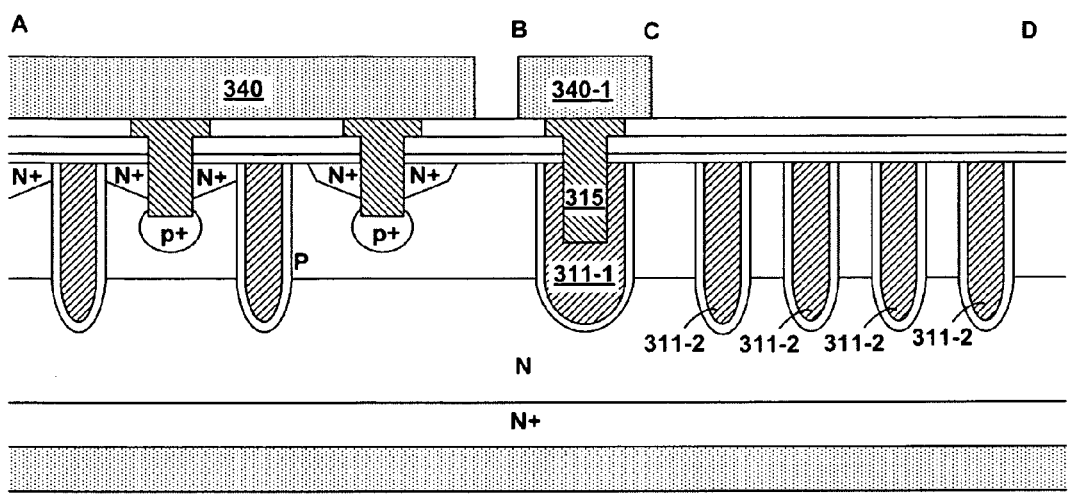
FIG. 8 is the side cross-sectional view of another preferred embodiment with termination area having trench floating rings.

FIG. 8 shows the cross section view of an N-channel trench MOSFET with termination area having trench floating rings 311-2, which also is the A-B-C-D cross section of FIGS. 7A and 7B, wherein said N-channel trench MOSFET is the same structure as FIG. 2A. Between said N-channel MOSFET and said termination area, a wider trenched gate 311-1 is formed to contact with gate metal 340-1 via trenched gate contact which is filled with tungsten plug 315.

Figure 9A:
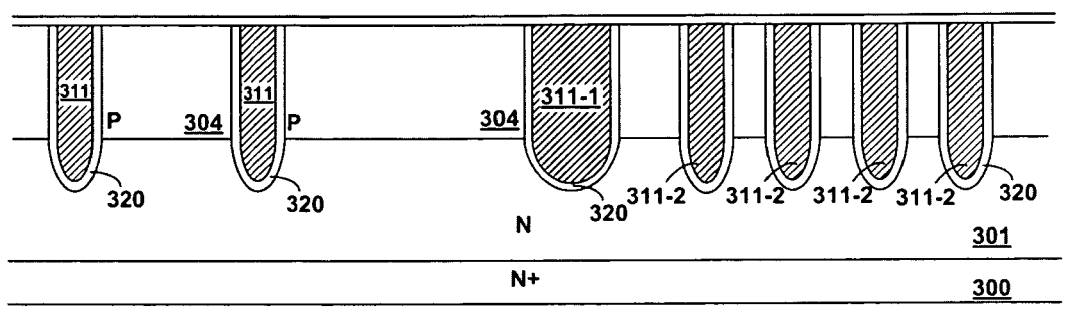
FIG. 9A to 9D are a serial of side cross-sectional views for showing the processing steps for fabricating the trench MOSFET as shown in FIG. 8.

FIGS. 9A to 9D are a serial of exemplary steps that are performed to form the preferred N-channel trench MOSFET in FIG. 8. In FIG. 9A, an N doped epitaxial layer 301 is grown on an N+ substrate 300. A trench mask (not shown) is employed to define a plurality of gate trenches for trench MOSFET, a wider gate trench for gate connection and a plurality of floating rings for termination area. Then, these trenches are dry Si etched to a certain depth. After that, a sacrificial oxide layer is grown and then removed to eliminate the plasma damage may introduced during etching process. Next, a first insulation layer is deposited overlying the inner surface of all trenches to serve as gate oxide 320 onto which doped poly is deposited within those trenches and then etched back or CMP (Chemical Mechanical Polishing) to form trenches gates 311 for trench MOSFET, a wider trench gate 311-1 for gate connection, and trenches rings 311-2 for termination area. Then, over the entire top surface, a step of P dopant Ion Implantation is carried out for the formation of P body regions 304, and then followed by a step of diffusion for P body drive-in.

Figure 9B:
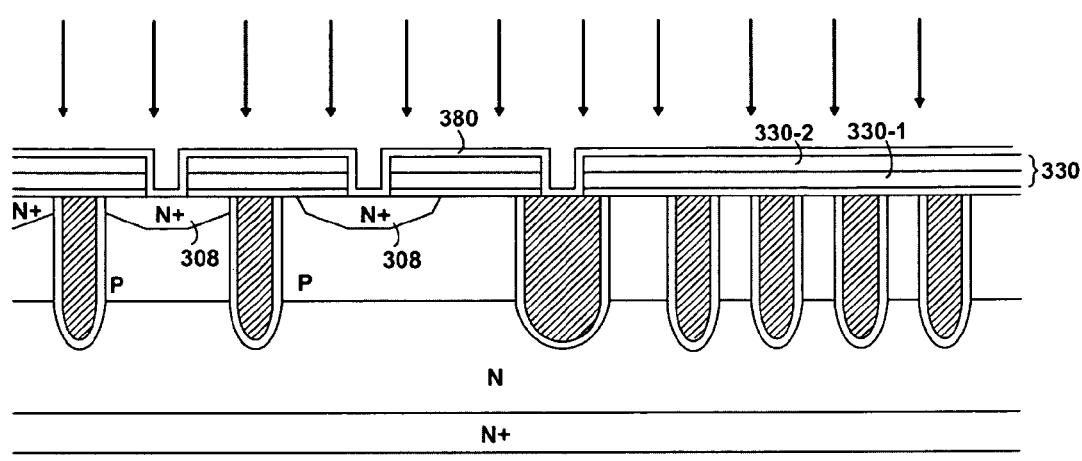

In FIG. 9B, a layer of un-doped SRO 330-1 and a layer of BPSG or PSG 330-2 are successively deposited onto top surface of said epitaxial layer. Then, a contact mask (not shown) is applied to define the trenches for trenched source-body contact and trenched gate contact. After the removal of the contact mask, a screen oxide 380, which is about 300A, is deposited along the contact areas and surface of said BPSG or PSG layer 330-2. Then, a step of N+ Souce Ion Implantation is carried out over entire top surface for the formation of said N+ source region, and followed by a step of diffusion for N+ source region drive-in.

Figure 9C:
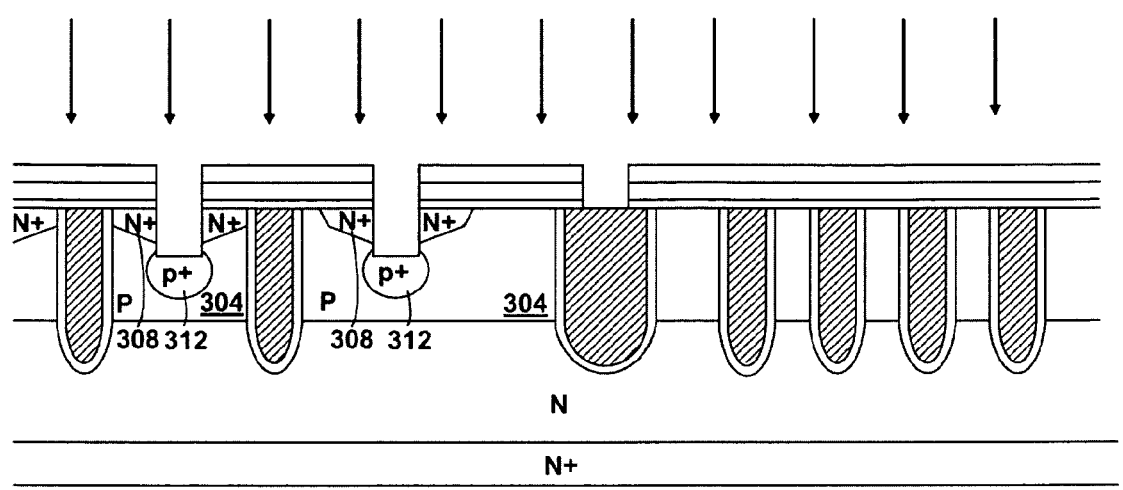

In FIG. 9C, the screen oxide is first removed by dry or wet oxide etching. Then, a step of dry Si etch is carried out to etch said contact trenches into said source region 308, said body region 304 and said wider trenched gate 311-1, respectively. After that, BF2 Ion is implanted over entire top surface to form p+ body contact resistance reduction area 312 underneath each bottom of said trenched source-body contact and followed by a step of RTA (Rapid Thermal Annealing) to activate BF2.

Figure 9D:
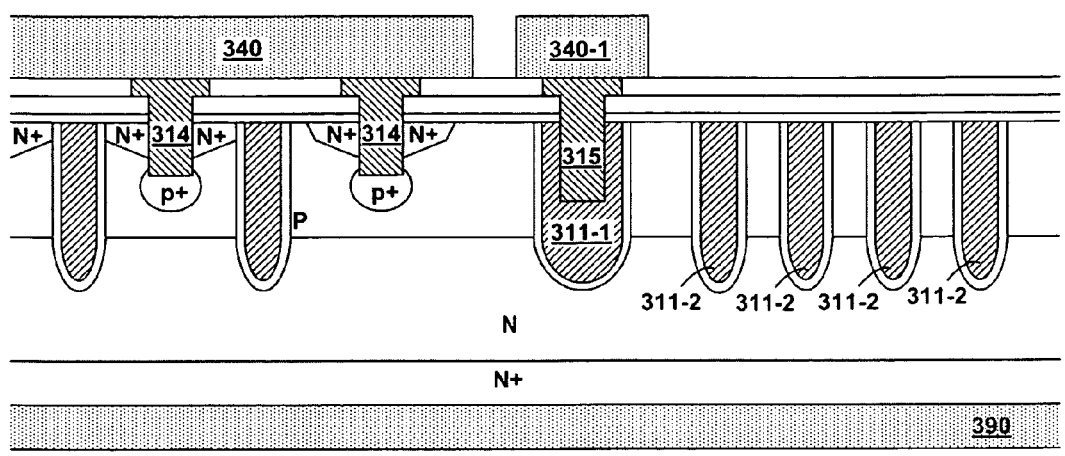

In FIG. 9D, wet etching in dilute HF is carried out to enlarge the contact width in BPSG and a barrier layer of Ti/TiN or Co/TiN and contact trench filling-in material tungsten is successively deposited and then etched back or CMP to form tungsten plugs 314 and 315 filled in trenched source-body contact and trenched gate contact, respectively. Then, a metal layer of Al/Cu is deposited after Ti or Co silicide formation by RTA, over a resistance reduction layer of Ti or TiN and patterned by a metal mask (not shown) to form source metal 340 and gate metal 340-1 by metal etching. Last, after the backside grinding, backside metal 390 is deposited onto the rear side of said substrate.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A method for manufacturing a trench MOSFET having source regions defined by a contact mask, comprising the steps of:
    growing an epitaxial layer with a first conductivity type upon a heavily doped substrate with said first conductivity type;
    applying a trench mask and forming a plurality of first gate trenches in source metal area, and at least a second gate trench having wider gate trench than said first gate trenches in gate runner metal area, and multiple third gate trenches in termination area;
    growing a sacrificial oxide layer onto inner surface of all the gate trenches to remove plasma damage;
    removing said sacrificial oxide layer and growing or depositing a first insulation layer along said inner surface of said first, second and third gate trenches as a gate oxide;
    forming doped polysilicon with said first conductivity type into said first, second and third gate trenches and etching back or CMP said doped polysilicon;
    implanting said epitaxial layer with a second conductivity type dopant and diffusing it to form body regions without having a body mask;
    depositing a second insulating layer functioning as a thick oxide interlayer on the top surface of the epitaxial layer and said first, second and third gate trenches;
    applying said contact mask and performing dry oxide etching to remove said oxide interlayer from contact open areas defined by said contact mask;
    implanting said contact open areas with source dopant without having a source mask, and further diffusing it to form said source regions with said first conductivity type;
    forming trenched source-body contacts into said body regions and at least a trenched gate contact into said doped polysilicon in said second gate trench by dry silicon and polysilicon etches through said contact open areas, respectively and simultaneously; and
    ion implanting said trenched source-body contacts with a dopant having said second conductivity type and activating it by RTA to form a body contact resistance reduction area with said second conductivity type around each of said trenched source-body contacts.

2. The method of claim 1, wherein said gate oxide is thermally grown in said first, second and third gate trenches with substantially uniform along along trench sidewall and trench bottom.

3. The method of claim 1, wherein said gate oxide has thicker oxide on trench bottom than trench sidewall in said first, second and third gate trenches.

4. The method of claim 1, wherein said oxide interlayer is composed of undoped SRO (Silicon Rich oxide) and BPSG or PSG.

5. The method of claim 1, further comprising depositing a screen oxide layer after said dry oxide etching to open said contact open areas, and removing said screen oxide layer after implanting of said source dopant.

6. The method of claim 1, wherein said trenched source-body contacts and said trenched gate contact are filled with Ti/TiN/W or Co/TiN/W metal plugs connecting with a resistance reduction layer of Ti or Ti/TiN underneath a front metal layer of Al alloys; and a metal mask is applied and said front metal layer is etched to respectively form said source metal area and said gate runner metal area.

7. The method of claim 1, wherein said trenched source-body contacts and said trenched gate contact are filled with a front metal of Al alloys padded with a barrier layer of Ti/TiN or Co/TiN; and a metal mask is applied and said front metal layer is etched to respectively form said source metal area and said gate runner metal area.

8. The method of claim 4, further comprising performing a wet etch using dilute HF after formation of said body contact resistance reduction area to remove said BPSG or PSG ranging from 300A~2000A for enlarging contact CD of said contact open areas in said BPSG or PSG.

* * * * *